United States Patent [19]
Abo

[11] Patent Number: 6,055,209
[45] Date of Patent: Apr. 25, 2000

[54] SYNCHRONOUS SEMICONDUCTOR MEMORY DEVICE EXHIBITING AN OPERATION SYNCHRONOUS WITH AN EXTERNALLY INPUTTED CLOCK SIGNAL

[75] Inventor: Hisashi Abo, Tokyo, Japan

[73] Assignee: NEC Corporation, Tokyo, Japan

[21] Appl. No.: 09/106,101

[22] Filed: Jun. 29, 1998

[30] Foreign Application Priority Data

Jun. 27, 1997 [JP] Japan .................................. 9-187806

[51] Int. Cl.[7] .................................................. G11C 8/00
[52] U.S. Cl. ...................... 365/233; 365/201; 365/230.06
[58] Field of Search ............................... 365/233, 230.06, 365/191, 189.07, 192, 201

[56] References Cited

U.S. PATENT DOCUMENTS

| 5,598,376 | 1/1997 | Merritt et al. | 365/230.06 |
| 5,784,332 | 7/1998 | Zheng et al. | 365/233 |
| 5,815,462 | 9/1998 | Konishi et al. | 365/233 |

*Primary Examiner*—David Nelms
*Assistant Examiner*—Thong Le
*Attorney, Agent, or Firm*—Young & Thompson

[57] ABSTRACT

A synchronous semiconductor memory device has a pseudo internal command signal generator for generating a pseudo internal command signal which controls, in non-synchronizing with an externally inputted clock signal, an internal command signal having been generated in synchronizing with the externally inputted clock signal.

10 Claims, 9 Drawing Sheets

SYNCHRONOUS SEMICONDUCTOR MEMORY DEVICE EXHIBITING AN OPERATION SYNCHRONOUS WITH AN EXTERNALLY INPUTTED CLOCK SIGNAL

BACKGROUND OF THE INVENTION

The present invention relates to a synchronous semiconductor devices and a synchronous semiconductor device exhibiting an operation synchronous with an externally inputted lock signal.

In recent years, the requirement for improvement in semiconductor memory devices exhibiting high speed performances have been on the increase. In order to realize the semiconductor memory device exhibiting the required high speed performances, there was proposed a synchronous semiconductor memory device operable in synchronizing with the externally inputted lock signal. The conventional dynamic random access memory is of the asynchronous type. Recently, however, the synchronous dynamic random access memory was proposed which is operable in synchronizing with the externally inputted lock signal.

FIG. 1 is a block diagram illustrative of the conventional synchronous dynamic random access memory.

A clock generator circuit 101 is provided for generating a clock signal. A command decoder 102 is also provided which is connected to the clock generator circuit 101 for receiving the clock signal so that the command decoder 102 receives controls signals at the rise-timing of the clock signals. The control signals to be inputted into the command data decoder 102 comprise a chip select bar (CS), a row address strobe bar (RAS), a column address strobe bar (CAS), and a write enable bar (WE). The command decoder 102 decodes the control signals to generate a "command" based upon combination of voltage levels of the control signals. There are also provided a mode resistor 103, a control circuit 106, a row address buffer circuit 104, a column address buffer circuit 105, a row decoder circuit 108, a column decoder circuit 111, a sense amplifier 110, a memory cell array 107, a data control circuit 112, a latch circuit 113, and an input/output buffer 109. The synchronous dynamic random access memory is operated in synchronizing with the clock signal 93 generated by the clock signal generator 101.

The following descriptions are concerned with how to write data into memory cells. An active command is inputted so that an externally inputted address signal is latched as a row address by the row address buffer circuit 104 for subsequent decoding the same by the row decoder circuit 108 to decide the row address thereby to select a word line of the memory cell array 107. Subsequently, a write command is inputted so that the externally inputted address signal is latched as a column address by the column address buer circuit 105 to decide the row address thereby to select Y-switch not illustrated, whereby the externally inputted write data are written into the memory cells. Finally, a precharge command is inputted to make non-selected state the word line selected in accordance with the active command.

The operation of reading out data will subsequently be described. At the same time when data are written, the row address is decided in accordance with the active command before a read command is inputted.

Processings of the internal command signals and the internal control signals will be described with reference to FIGS. 2 and 3. FIG. 2 is a block diagram illustrative of a row address control signal generator circuit in the conventional synchronous dynamic random access memory of FIG. 1. FIG. 3 is a diagram illustrative of waveforms of internal command signals and internal control signals in the conventional synchronous dynamic random access memory.

A command decoder 81 of FIG. 2 corresponds to the command decoder 102 of FIG. 1. A row address control signal generator circuit 82 of FIG. 2 corresponds to a row address control signal generator circuit accommodated in the control circuit 106. The command decoder 81 generates internal command signals 71 and 72. The row address control signal generator circuit 82 is connected to the command decoder 81 for receiving the internal command signals 71 and 72 from the command decoder 81. The row address control signal generator circuit 82 comprises a flip-flop circuit and a series connection of first and second invertors 86 and 87. The flip-flop circuit comprises first and second NOR gates 84 and 85. The first NOR gate 84 has two input terminals connected to the command decoder 81 and an output terminal of the second NOR gate 85 for receiving the internal command signal 71 and an output signal from the second NOR gate 85. The first NOR gate 84 also has an output terminal connected to an input terminal of the invertor 86 and also connected to one of the two input terminals of the second NOR gate 85 for transmitting an output signal to the invertor 86 and the second NOR gate 85. The second NOR gate 85 has two input terminals connected to the command decoder 81 and the output terminal of the first NOR gate 84 for receiving the internal command signal 72 and the output signal from the first NOR gate 84. The second NOR gate 85 also has an output terminal connected to one of the two input terminals of the first NOR gate 84 for transmitting an output signal to the first NOR gate 84. The first invertor 86 receives the output signal from the first NOR gate 84. The second invertor 87 receives an output signal from the first invertor 86 and outputs a row address control signal 73.

Operations of the row address control signal generator circuit in the conventional synchronous dynamic random access memory will be described with reference to FIG. 3.

If, at the rise-time of the clock signal CLK, the row address strobe bar and the chip select bar are low level whilst the column address strobe bar and the write enable bar are high level, then those combinations of the signals means "active command", whereby the command decoder 81 is operated to make the internal command signal 71 in high level which indicates the input of the active command. Namely, the internal command signal 71 is made into the high level. After the internal command signal 71 was made into the high level, then a column address control signal 73 is made into the low level. Thereafter, if the internal command signal 71 is returned to the low level, then the column address control signal 73 remains low level. Consequently, the conventional row address control signal generator circuit is operated so that when the column address control signal 73 is made into the low level, the row address circuit is activated.

If, in rise-time of the clock signal CLK, the row address strobe bar, the write enable bar and the chip select bar are low level whilst the column address strobe bar is high level, then the command decoder 81 is operated to make the internal command signal 72 into the high level during one cycle so as to indicate the input of the pre-charge command. In the activated state of the row address control signal, the internal command signal 72 is made into high level, whereby the row address control signal 73 is made into high level. As a result, if the internal command signal 72 is made into low level, then the row address control signal 73 remains high level.

It is hereby assumed that the write command was inputted in a clock cycle which is prior to, by one cycle, the clock cycle during which the pre-charge command is inputted. By input of the write command, the column address control signal not illustrated is activated to execute the write operation by taking a predetermined time from the input of the command.

In FIG. 3, the externally inputted clock signal has a clock cycle time t78. It takes a time t77 to inactivate the row address control signal after the pre-charge command has been inputted. This time period t77 is independent from the clock cycle t78. If the write command is inputted in the cycle just prior to the cycle during which the pre-charge command is inputted, it takes a time period t79 to inactivate the row address control signal from the rise-edge of the clock signal externally inputted upon the input of the write command. The time period t79 is the sum of the time period t77 and the time period t78. Namely, the time period t79 is dependent upon the clock cycle t78.

It takes a predetermined time after the write command was inputted to execute the write operation before the row address control signal is inactivated so that a word line is placed into a non-selected state, whereby a write operation is first permitted. This means it required to ensure a sufficiently long time period t79 for entry into the write enable state.

Since the time period t77 is independent from the clock cycle t78, the write enable state depends upon the clock cycle t78.

There is, however, a possibility of the appearance of a problem during a time period after the write operation and before the pre-charge operation. This problem is concerned with the insufficient write of data into the memory cells.

This problem is likely to appear when a contact resistance of the memory cell is extremely high. This causes a defective bit, for which reason such defective memory cell should be detected by a wafer test and relived by a redundancy circuit to realize a high yield.

The test of the synchronous dynamic random access memory is conducted by use of a memory tester, predetermined signals are inputted into a CLK pin, a CKE pin, a CS bar pin, an RAS bar pin, a CAS bar pin and a WE bar pin as well as a plurality of address pins and a plurality of data pins, in addition a power pin and a ground pin.

If the wafer is tested, a probe card is used to connect individual pads connected to the external input pins to individual pins of the memory tester.

The synchronous dynamic random access memory shows high speed operations, for which reason in order to conduct a sufficient test for all functions thereof, it is required to use a memory tester operable in high frequency range and a accurate tester jig. This test is a costly procedure.

Some of advanced synchronous random access memories are operated at a high frequency of not less than 100 MHz. In this case, it is difficult to input high frequency signals thereto. Due to the capacitance of the probes and the contact resistance to the pads of the device, the pulse signals are rounded. For this reason, it is difficult to conduct the test by inputting the high frequency signals. Actually, the wafer test is conducted by inputting a relative low frequency signal even when the device has a high speed performance.

In prior art, there is a problem with difficulty to conduct a timing-test restricted by the clock cycle of the externally inputted clock signal by use of a relatively low frequency tester, for example, when the pre-charge command is inputted into the cycle following to the cycle in which the write command was inputted.

There is another problem with difficulty in conducting a wafer test by inputting a high frequency signal.

In the above circumstances, it had been required to develop a synchronous semiconductor memory device free from the above problems.

SUMMARY OF THE INVENTION

Accordingly, it is an object of the present invention to provide a novel synchronous semiconductor memory device free from the above problems.

It is a further object of the present invention to provide a novel synchronous semiconductor memory device allowing a test substantially equivalent to a desirable high frequency test by sequential command inputs even when a low frequency tester is used.

It is a still further object of the present invention to provide a novel synchronous semiconductor memory device allowing a test substantially equivalent to a desirable high frequency test by sequential command inputs even if a high frequency test is difficult.

In accordance with the present invention, a synchronous semiconductor memory device has a pseudo internal command signal generator for generating a pseudo internal command signal which controls, in non-synchronizing with an externally inputted clock signal, an internal command signal having been generated in synchronizing with the externally inputted clock signal.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

In accordance with the present invention, a synchronous semiconductor memory device has a pseudo internal command signal generator for generating a pseudo internal command signal which controls, in non-synchronizing with an externally inputted clock signal, an internal command signal having been generated in synchronizing with the externally inputted clock signal.

It is preferable that the pseudo internal command signal is generated by an input signal into a non-bonding pad.

It is also preferable that the pseudo internal command signal is generated in synchronizing with an asynchronous signal externally inputted.

It is also preferable to provide a tester circuit generating the pseudo internal command signal in accordance with the internal control signal.

Namely, the novel synchronous semiconductor memory device is provided with the pseudo internal command signal generator for generating the pseudo internal command signal which controls, in non-synchronizing with an externally inputted clock signal, an internal command signal having been generated in synchronizing with the externally inputted clock signal. The pseudo internal command signal may be generated upon the signal inputted into the non-bonding pads.

Alternatively, the pseudo internal command signal may be generated by a circuit wherein a test mode signal is inputted into an internal control signal in non-synchronizing with the clock signal without inputting into a circuit such as a command decoder for receiving a normal input signal and outputting a synchronous signal with the clock signal.

Further alternatively, in accordance with the internal control signal generated by the input of a command, there is provided a circuit for generating an internal command signal of another command.

Consequently, the novel synchronous semiconductor memory device is provided with the pseudo internal command signal generator for generating the pseudo internal command signal which controls, in non-synchronizing with an externally inputted clock signal an internal command signal having been generated in synchronizing with the externally inputted clock signal, so that a test can be made under substantially equivalent condition to a desirable test by sequential command inputs at high frequency.

PREFERRED EMBODIMENTS

Figure 1:
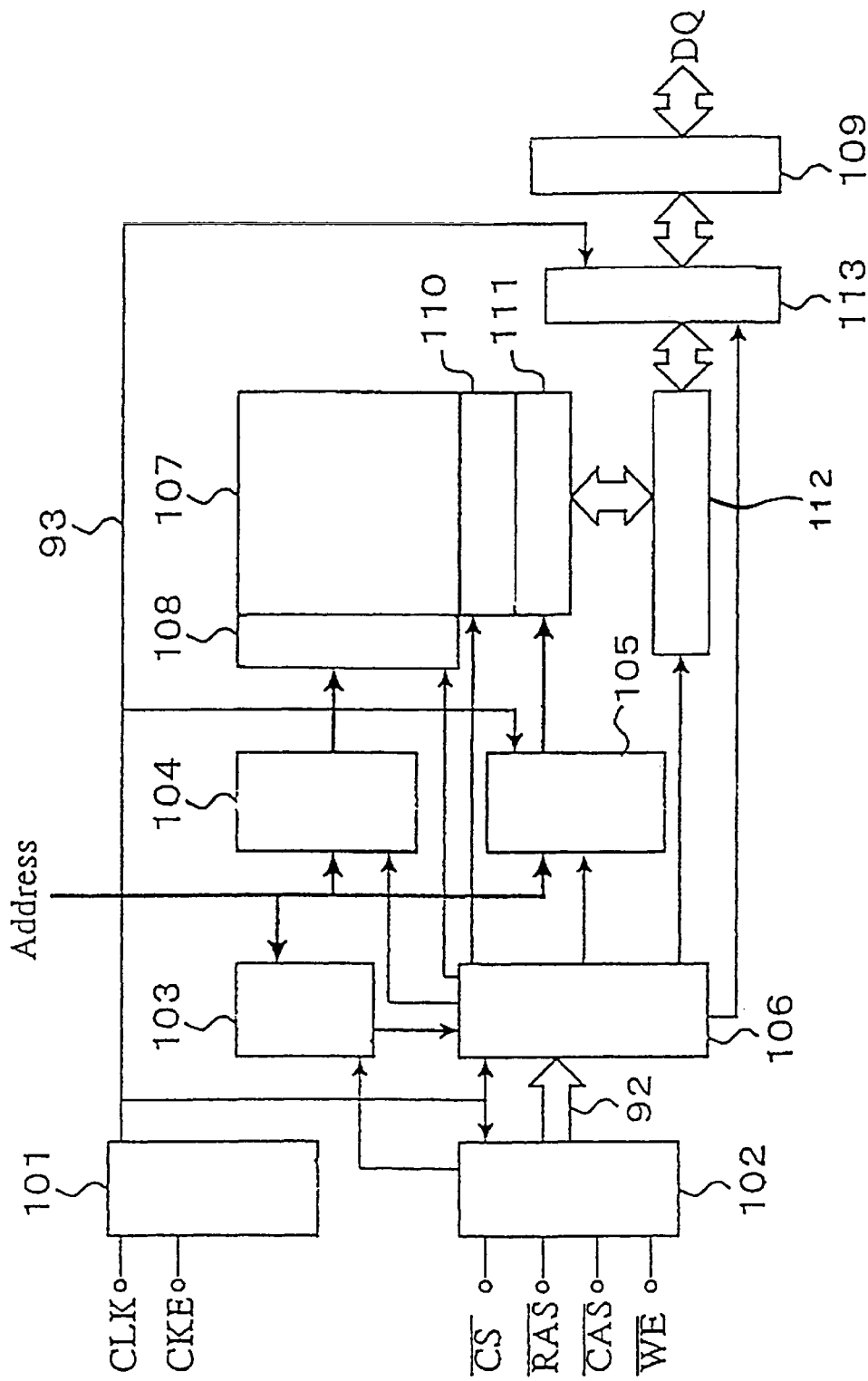
FIG. 1 is a block diagram illustrative of the conventional synchronous dynamic random access memory.

FIRST EMBODIMENT:

A first embodiment according to the present invention will be described in detail with reference to FIG. 4 which is a block diagram illustrative partially of a row address control signal generator circuit. A command decoder 21 of FIG. 4 corresponds to the command decoder 102 of FIG. 1. A row address control signal generator circuit 22 of FIG. 4 corresponds to a row address control signal generator circuit accommodated in the control circuit 106 of FIG. 1. The command decoder 21 generates internal command signals 11 and 12. The row address control signal generator circuit 22 is connected to the command decoder 21 for receiving the internal command signals It and 12 from the command decoder 21. The row address control signal generator circuit 22 comprises a flip-flop circuit and a series connection of first and second invertors 26 and 27. The flip-flop circuit comprises first and second NOR gates 24 and 25. The first NOR gate 24 has two input terminals connected to the command decoder 21 and an output terminal of the second NOR gate 25 for receiving the internal command signal 11 and an output signal from the second NOR gate 25. The first NOR gate 24 also has an output terminal connected to an input terminal of the invertor 26 and also connected to one of the three input terminals of the second NOR gate 25 for transmitting an output signal to the invertor 26 and the second NOR gate 25. The second NOR gate 25 has three input terminals connected to the command decoder 21 and the output terminal of the first NOR gate 24 as well as a buffer circuit for receiving the internal command signal 12 and the output signal from the first NOR gate 24 as well as an output signal 15 from the buffer circuit. The second NOR gate 25 also has an output terminal connected to one of the two input terminals of the first NOR gate 24 for transmitting an output signal to the first NOR gate 24. The first invertor 26 receives the output signal from the first NOR gate 24. The second invertor 27 receives an output signal from the first invertor 26 and outputs a row address control signal 13. The buffer circuit comprises a series connection of third and fourth invertors 28 and 29 and a resistance 23. The third invertor 28 has an input terminal connected to an input terminal into which an input signal 14 is inputted, so that the third invertor 28 receives the input signal 14. The input signal 14 is an input signal inputted on a pad which is not bonded. The resistance 23 is connected between the input terminal of the third invertor 28 and the ground line. The fourth invertor 29 has an input terminal connected to the output terminal of the third invertor 28. The fourth invertor 29 has an output terminal connected to third one of the three input terminals of the second NOR gate 25 so that the second NOR gate 25 receives the internal command signal 12 and the output signal from the first NOR gate 24 as well as the output signal 15 from the fourth invertor 29 in the buffer circuit.

Figure 5:
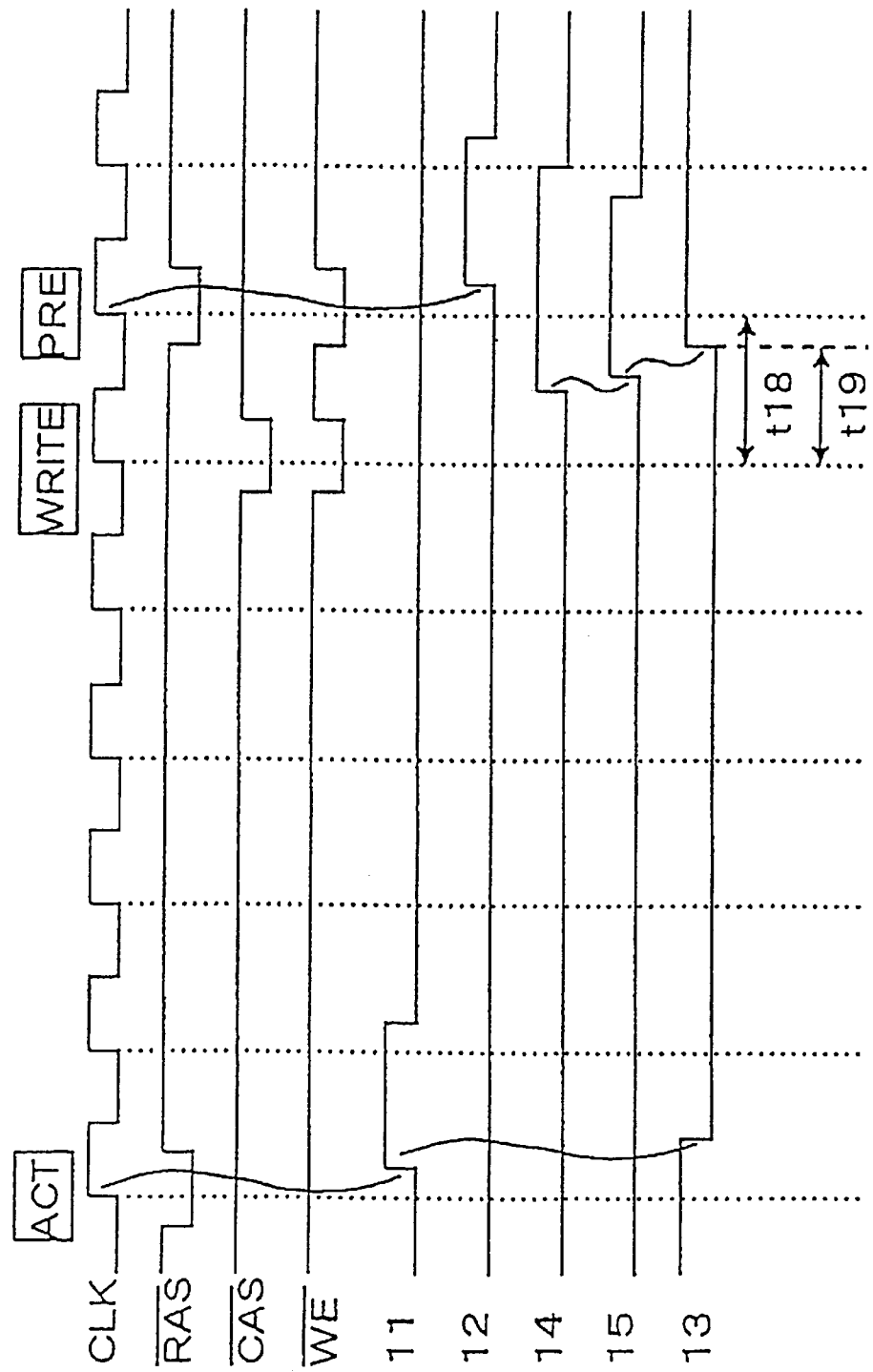
FIG. 5 which is a timing chart illustrative of waveforms of signals of the above novel row address control signal generator circuit.

The flip-flop circuit is set when the internal command signal 11 becomes high level. The flip-flop circuit is re-set when either the internal command signal 11 or the output signal 15 becomes high level. When the flip-flop circuit is set, the row address control signal 13 becomes low level. The row address control signal 13 is a row active signal Operations of the above novel row address control signal generator circuit will be described with reference to FIG. 5 which is a timing chart illustrative of waveforms of signals of the above novel row address control signal generator circuit.

The input signal 14 of the low level is externally inputted. If, at the rise-time of the clock signal CLK, the row address strobe bar and the chip select bar are low level whilst the column address strobe bar and the write enable bar are high level, then those combinations of the signals means "active command", whereby the command decoder 21 is operated to make the internal command signal 11 in high level which indicates the input of the active command during one cycle. Namely, the internal command signal 11 is made into the high level. After the internal command signal 12 was made into the high level, then a column address control signal 13 is made into the low level. Thereafter, if the internal command signal 11 is returned to the low level, then the column address control signal 13 remains low level. Consequently, the novel row address control signal generator circuit is operated so that when the column address control signal 13 is made into the low level, the row address circuit is activated.

During when the row address control signal 13 is activated, the input signal becomes high level, whereby the signal 15 also becomes high level for entry into the inactivated state.

Since the input signal 14 is inputted into the pad, the signal 14 is a varied in level in asynchronous with the externally inputted clock signal. The signal 14 may be changed from the low level to the high level at anytime. This means it possible to set an optional time t19 which is defined to be a time period from the input of the write command to when the row address control signal becomes high level.

If the above row address control signal generator is used in the synchronous dynamic random access memory being operated at 100 MHz, the clock cycle is 10 nanoseconds. Thus, the minimum time period from the input of the write command to the input of the pre-charge command is the same as the clock cycle 10 nanoseconds.

Figure 2:
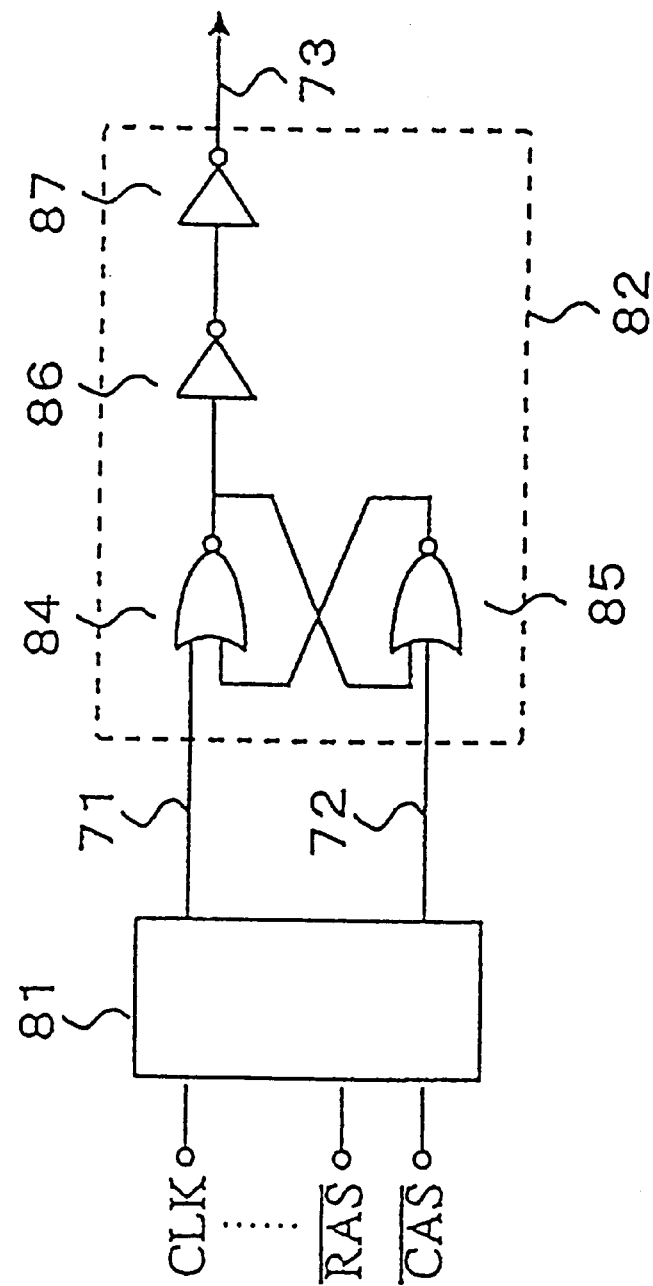
FIG. 2 is a block diagram illustrative of a row address control signal generator circuit in the conventional synchronous dynamic random access memory of FIG. 1.
Figure 3:
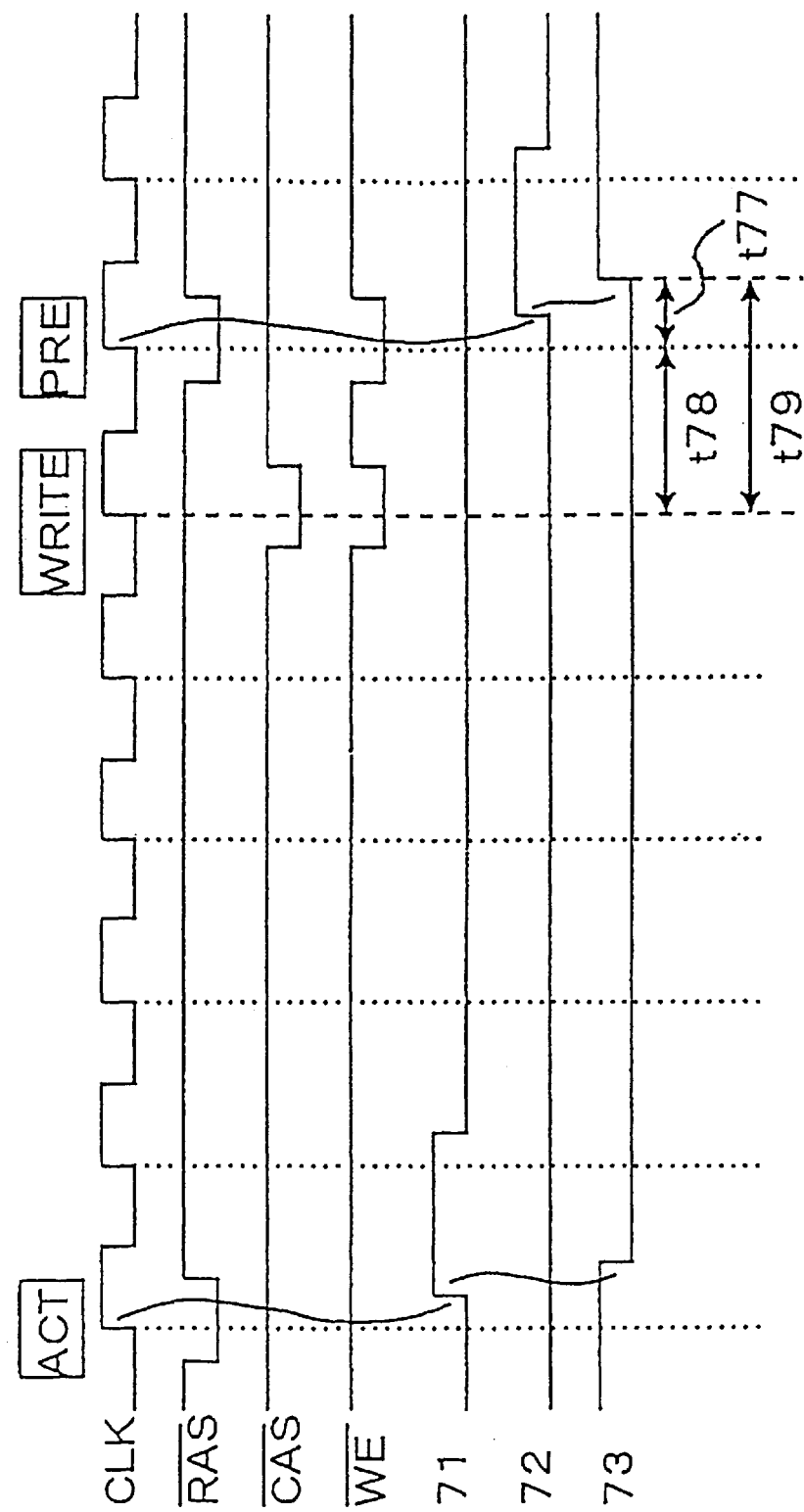
FIG. 3 is a timing chart illustrative of waveforms of internal command signals and internal control signals in the conventional synchronous dynamic random access memory.

If, however, the clock signal to be externally inputted is limited in frequency. If, for example, only the clock signal of 50 MHz is permitted, then the clock cycle is 20 nanoseconds. In this case, the time period t79 from the input of the write command to the inactivation of the row address control signal of the conventional circuit illustrated in FIG. 2 is given by $$t79=t78+t77=20 \text{ nanoseconds}+t77$$

Figure 4:
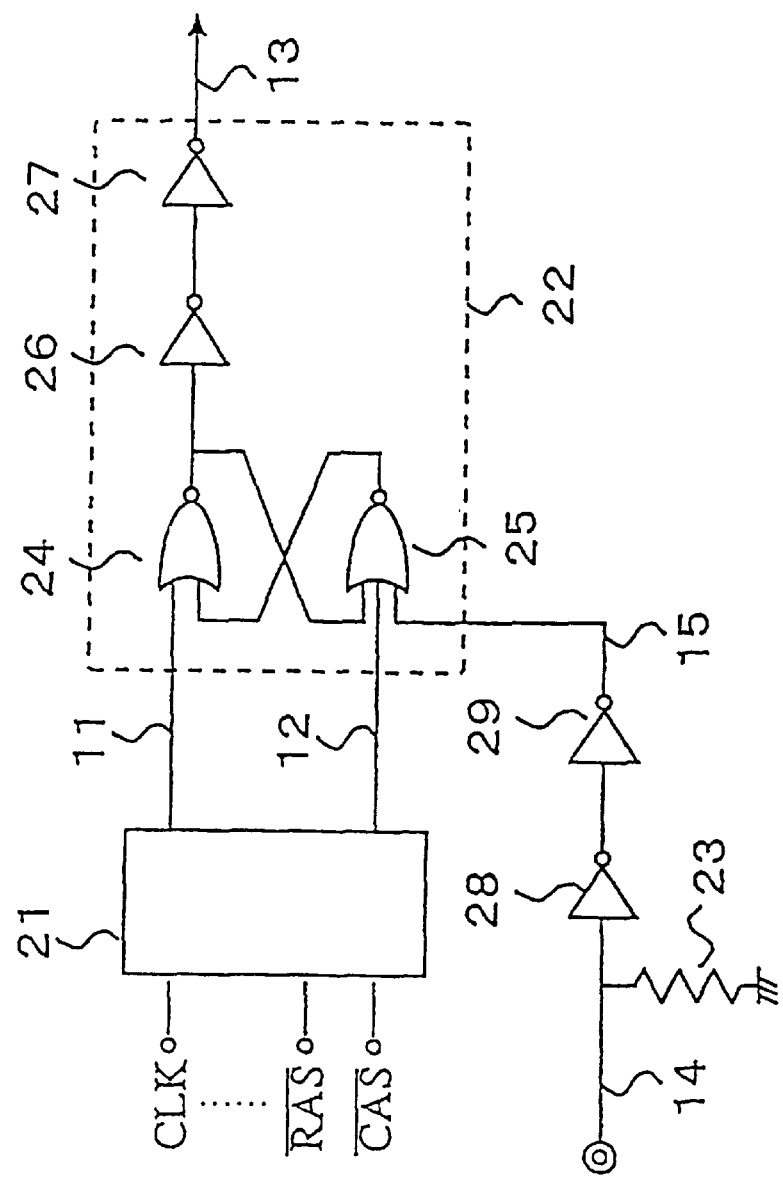
FIG. 4 which is a block diagram illustrative partially of a novel row address control signal generator circuit in a first embodiment in accordance with the present invention.

By contrast, in accordance with the present invention, the time period t19 from the input of the write command to the inactivation of the row address control signal of the novel circuit illustrated in FIG. 4 is optional which is independent from the clock cycle 18.

The input signal 14 is inputted that the time period t79 under condition of t78=10 nanoseconds is equal to the time period t19, so that independently from the frequency of the clock signal, the time period from the write command input to the row address control signal inactivation is equal to that when the clock signal of 10 MHz is inputted.

Consequently, the above novel synchronous semiconductor memory device is provided with the pseudo internal command signal generator for generating the pseudo internal command signal which controls, in non-synchronizing with an externally inputted clock signal, an internal command signal having been generated in synchronizing with the externally inputted clock signal, so that a test can be made under a substantially equivalent condition to a desirable test by sequential command inputs at high frequency, even when the low frequency tester is used or the test at the high frequency is difficult.

Figure 6:
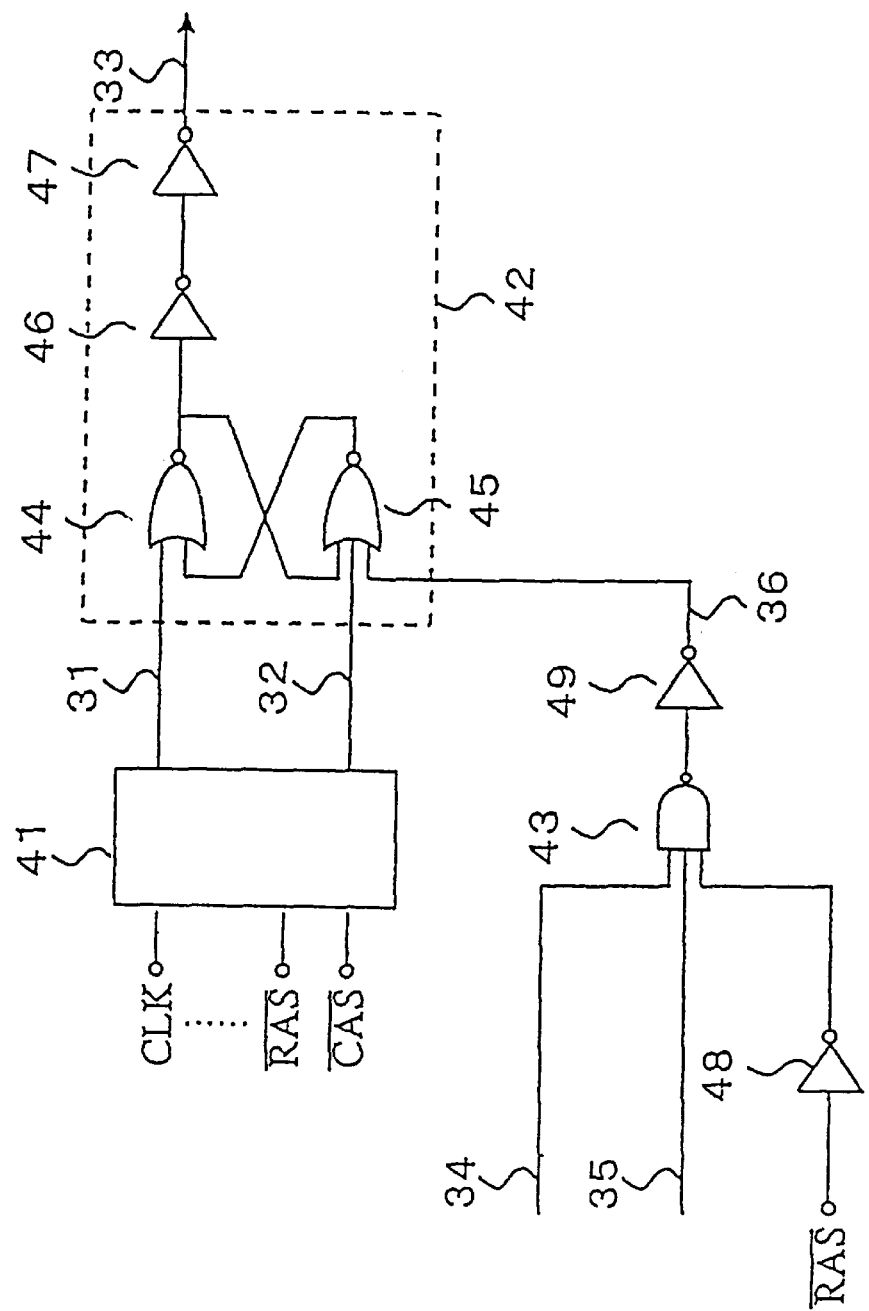
FIG. 6 which is a block diagram illustrative partially of a novel row address control signal generator circuit in a second embodiment in accordance with the present invention.

SECOND EMBODIMENT:

A second embodiment according to the present invention will be described in detail with reference to FIG. 6 which is a block diagram illustrative partially of a row address control signal generator circuit. A command decoder 41 of FIG. 6 corresponds to the command decoder 102 of FIG. 1. A row address control signal generator circuit 42 of FIG. 6 corresponds to a row address control signal generator circuit accommodated in the control circuit 106 of FIG. 1. The command decoder 41 generates internal command signals 31 and 32. The row address control signal generator circuit 42 is connected to the command decoder 41 for receiving the internal command signals 31 and 32 from the command decoder 41. The row address control signal generator circuit 42 comprises a flip-flop circuit and a series connection of first and second invertors 46 and 47. The flip-flop circuit comprises first and second NOR gates 44 and 45. The first NOR gate 44 has two input terminals connected to the command decoder 41 and an output terminal of the second NOR gate 45 for receiving the internal command signal 31 and an output signal from the second NOR gate 45. The first NOR gate 44 also has an output terminal connected to an input terminal of the invertor 46 and also connected to one of three input terminals of the second NOR gate 45 for transmitting an output signal to the invertor 46 and the second NOR gate 45. The second NOR gate 45 has three input terminals connected to the command decoder 41 and the output terminal of the first NOR gate 44 as well as a buffer circuit for receiving the internal command signal 32 and the output signal from the first NOR gate 44 as well as an output signal 36 from the buffer circuit. The second NOR gate 45 also has an output terminal connected to one of the two input terminals of the first NOR gate 44 for transmitting an output signal to the first NOR gate 44. The first invertor 46 receives the output signal from the first NOR gate 44. The second invertor 47 receives an output signal from the first invertor 46 and outputs a row address control signal 33. The logic circuit comprises a series connection of a third invertor 48, a NAND gate 43, a fourth invertor 49. The third invertor 48 has an input terminal connected to an input terminal into which a row address strobe bar is inputted, so that the third invertor 48 receives the row address strobe bar. The input signals 34 and 35 are input signals inputted into two of the three input terminals of the NAB gate 43. The signal 34 is a test mode signal which is in high level in test mode. The signal 35 is a write control signal in high level during write operation. The output signal from the NAND gate 43 is inputted into the fourth invertor 49. The output signal 36 from the fourth invertor 49 is inputted into the row address control signal generator circuit 42, for example, inputted into one of the three input terminals of the second NOR gate 45. The first and second NOR gates 44 and 45 are in the form of flip-flop circuit wherein if the signal 31 becomes high level, this circuit is set, and if the signal 36 becomes high level, then the circuit is re-set.

Figure 7:
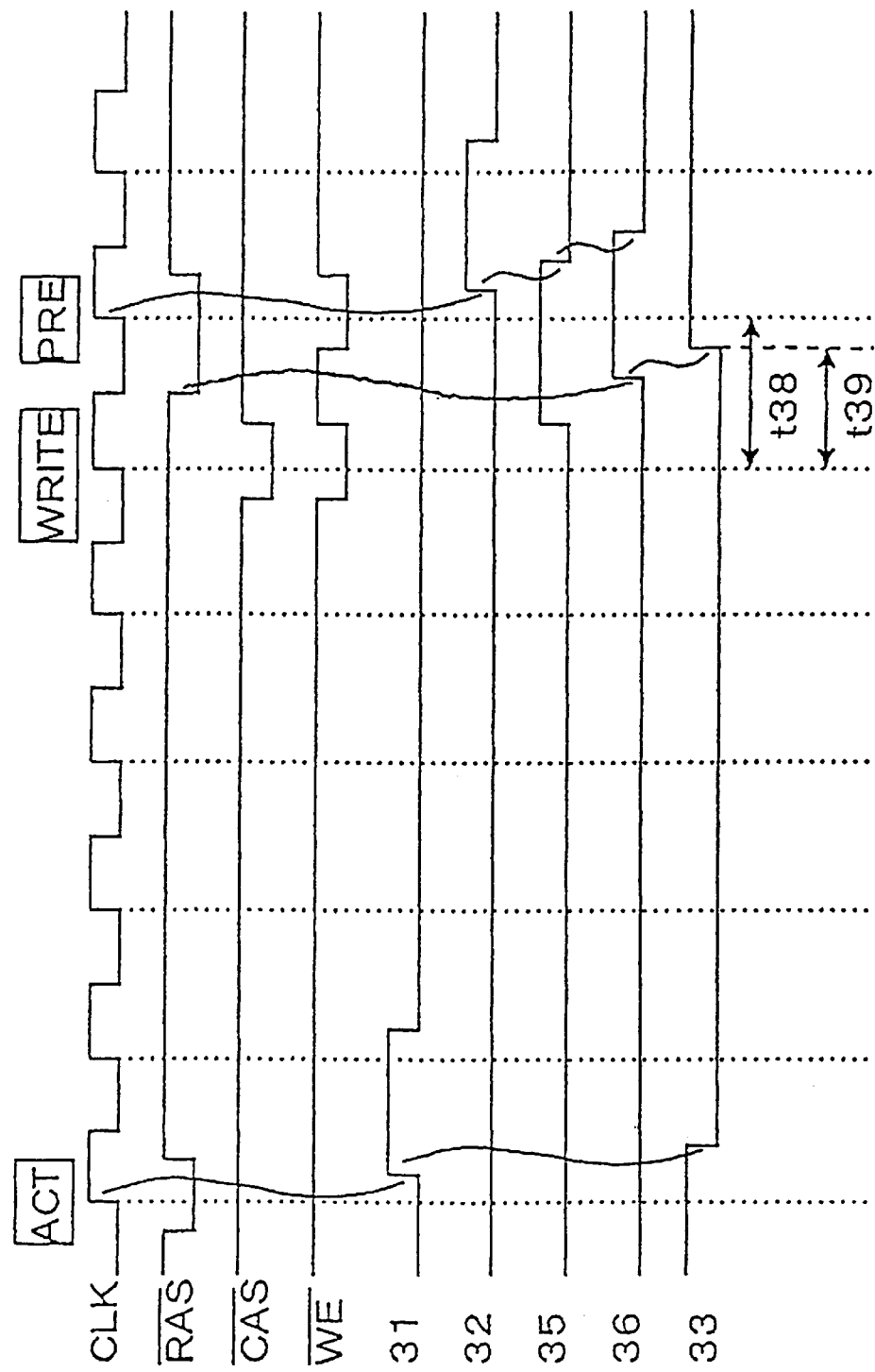
FIG. 7 which is a timing chart illustrative of waveforms of signals of the above novel row address control signal generator circuit.

Operations of the above novel row address control signal generator circuit will be described with reference to FIG. 7 which is a timing chart illustrative of waveforms of signals of the above novel row address control signal generator circuit.

If, at the rise-time of the clock signal CLK, the row address strobe bar and the chip select bar are low level whilst the column address strobe bar and the write enable bar are high level, then those combinations of the signals means "active command", whereby the command decoder 41 is operated to make the internal command signal 31 in high level which indicates the input of the active command during one cycle. Namely, the internal command signal 31 is made into the high level. After the internal command signal 31 was made into the high level, then a column address control signal 33 is made into the low level. Thereafter, if the internal command signal 31 is returned to the low level, then the column address control signal 33 remains low level. Consequently, the novel row address control signal generator circuit is operated so that when the write command is inputted, then the write operation control signal 35 becomes high level to remain at this level until the write operation is finished.

During when the row address control signal 33 is activated, the row address strobe bar becomes high level whereby the signal 36 becomes high level. As a result, the row address control signal becomes high level, whereby the signal 35 also becomes high level for entry into the inactivated state.

Since the test mode signal 34 and the write operation control signal 35 are inputted as enable signals, the internal pre-charge command signal is generated in non-synchronizing with the row address strobe bar.

The row address strobe bar signal provides an influence to the normal command input, for which reason it is necessary to hold the signal at high level during the holding time duration against the rise-edge of the lock signal CLK in the write command input cycle, but thereafter permitted to be low level. The time period t39 from the write command input to the inactivation of the row address control signal may optionally be set independently from the frequency of the clock cycle of the clock signals externally inputted. It is possible to conduct a test substantially equivalent to when a high frequency clock signal is inputted.

Consequently, the above novel synchronous semiconductor memory device is provided with the pseudo internal command signal generator for generating the pseudo internal command signal which controls, in non-synchronizing with an externally inputted clock signal, an internal command signal having been generated in synchronizing with the externally inputted clock signal, so that a test can be made under substantially equivalent condition to a desirable test by sequential command inputs at high frequency, even when the low frequency tester is used or the test at the high frequency is difficult.

Figure 8:
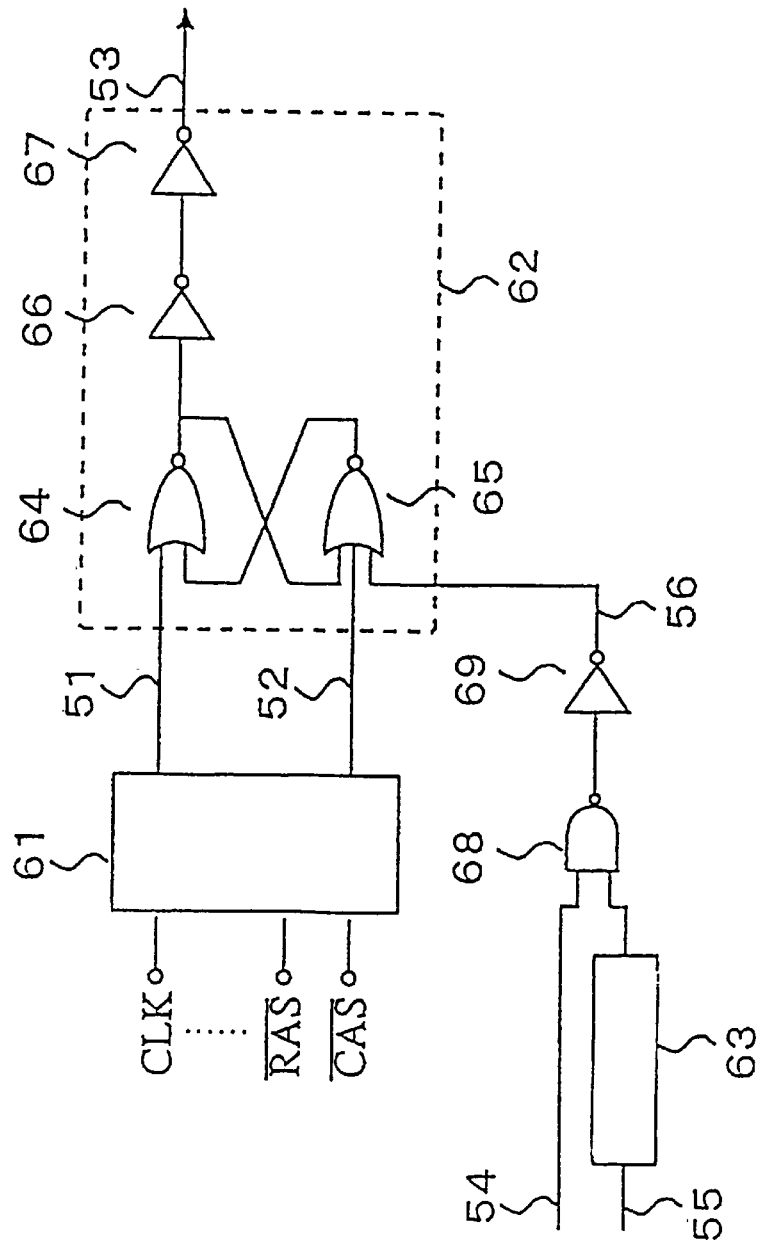
FIG. 8 which is a block diagram illustrative partially of a novel row address control signal generator circuit in a third embodiment in accordance with the present invention.

THIRD EMBODIMENT:

A third embodiment according to the present invention will be described in detail with reference to FIG. 8 which is a block diagram illustrative partially of a row address control signal generator circuit. A command decoder 61 of FIG. 8 corresponds to the command decoder 102 of FIG. 1. A row address control signal generator circuit 62 of FIG. 8 corresponds to a row address control signal generator circuit accommodated in the control circuit 106 of FIG. 1. The command decoder 61 generates internal command signals 51 and 52. The row address control signal generator circuit 62 is connected to the command decoder 61 for receiving the internal command signals 51 and 52 from the command decoder 61. The row address control signal generator circuit 62 comprises a flip-flop circuit and a series connection of first and second invertors 66 and 67. The flip-flop circuit comprises first and second NOR gates 64 and 65. The first NOR gate 64 has two input terminals connected to the command decoder 61 and an output terminal of the second NOR gate 65 for receiving the internal command signal 51 and an output signal from the second NOR gate 65. The first NOR gate 64 also has an output terminal connected to an input terminal of the invertor 66 and also connected to one of three input terminals of the second NOR gate 65 for transmitting an output signal to the invertor 66 and the second NOR gate 65. The second NOR gate 65 has three input terminals connected to the command decoder 61 and the output terminal of the first NOR gate 64 as well as a buffer circuit for receiving the internal command signal 52 and the output signal from the first NOR gate 64 as well as an output signal 55 from the buffer circuit. The second NOR gate 65 also has an output terminal connected to one of the two input terminals of the first NOR gate 64 for transmitting an output signal to the first NOR gate 64. The first invertor 66 receives the output signal from the first NOR gate 64. The second invertor 67 receives an output signal from the first invertor 66 and outputs a row address control signal 53. The logic circuit comprises a series connection of a third invertor 69, a NAND gate 68, and a delay circuit 63. The input signal 54 is an input signal inputted into one of the two input terminals of the NAND gate 68. The other input signal 55 is inputted into the delay circuit 63. An output of the delay circuit is also inputted into the remaining one of the two input terminals of the NAND gate 68. The signal 54 is a test mode signal which is in high level in test mode. The signal 55 is a write control signal in high level during write operation. The output signal from the NAND gate 68 is inputted into the third invertor 69. The output signal 56 from the third invertor 69 is inputted into the row address control signal generator circuit 62, for example, inputted into one of the three input terminals of the second NOR gate 65. The first and second NOR gates 64 and 65 are in the form of flip-flop circuit wherein if the signal 51 becomes high level, this circuit is set, and if the signal 56 becomes high level, then the circuit is re-set. In this embodiment, the test mode signal 54 have become the high level so as to generate the internal pre-charge command.

Figure 9:
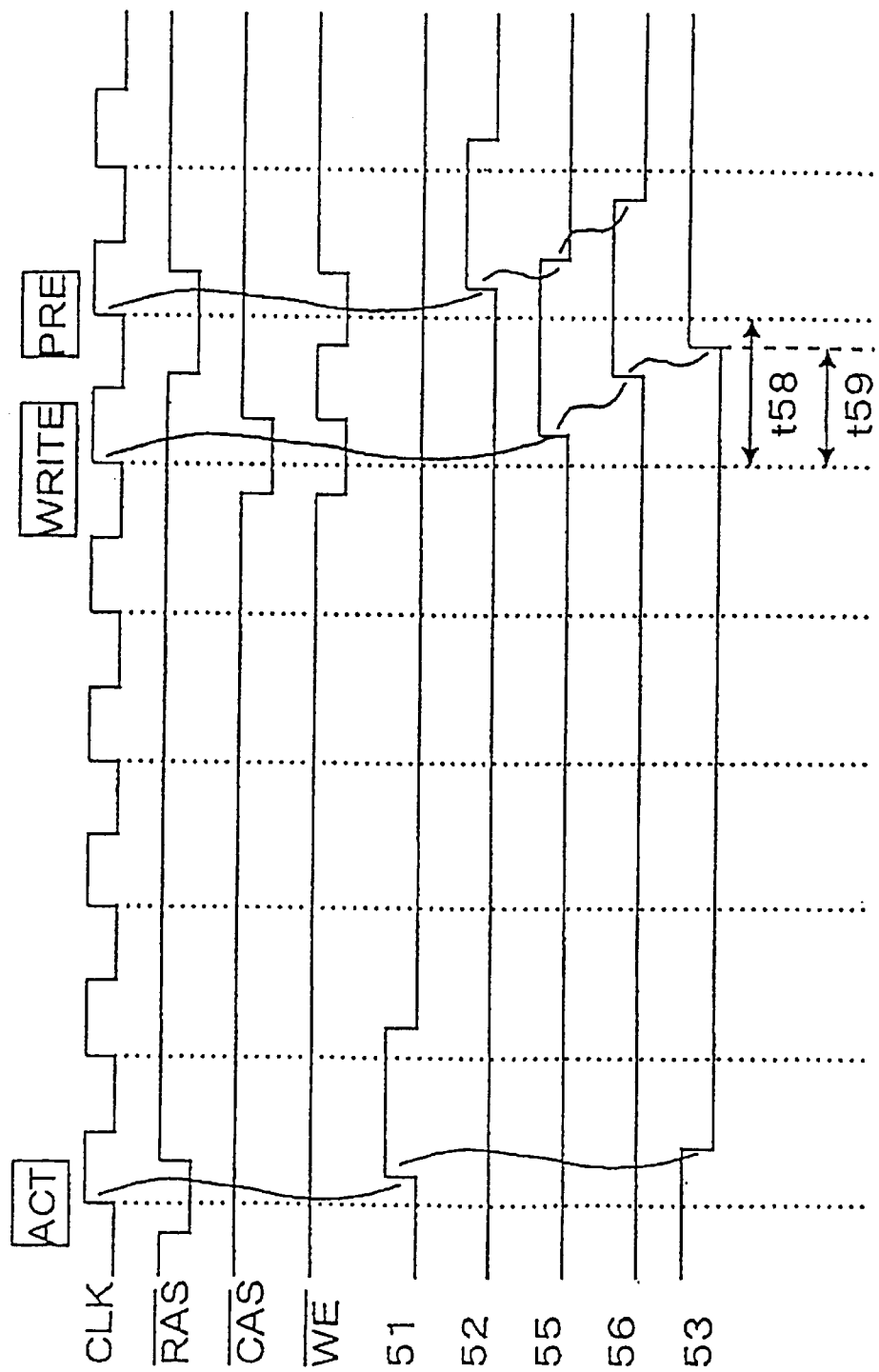
FIG. 9 which is a timing chart illustrative of waveforms of signals of the above novel row address control signal generator circuit.

Operations of the above novel row address control signal generator circuit will be described with reference to FIG. 9 which is a timing chart illustrative of waveforms of signals of the above novel row address control signal generator circuit.

If, at the rise-time of the clock signal CLK, the row address strobe bar and the chip select bar are low level whilst the column address strobe bar and the write enable bar are high level, then those combinations of the signals means "active command", whereby the command decoder 61 is operated to make the internal command signal 51 in high level which indicates the input of the active command during one cycle. Namely, the internal command signal 51 is made into the high level. After the internal command signal 51 was made into the high level, then a column address control signal 53 is made into the low level. Thereafter, if the internal command signal 51 is returned to the low level, then the column address control signal 53 remains low level. Consequently, the novel row address control signal generator circuit is operated so that when the write command is inputted, then the write operation control signal 55 becomes high level to remain at this level until the write operation is finished.

During when the row address control signal 53 is activated, the write command is inputted to have the write operation control signal 55 become high level and after a predetermined time duration, the signal 56 becomes high level. As a result, the row address control signal 53 becomes high level for entry into the inactivated state.

Since the delay time of the signal in the delay circuit 63 is optionally determined in design of the circuit, a time period t59 from the write command input to the inactivation of the row address control signal may optionally be set independently from the clock cycle t58. It is possible to conduct a test substantially equal to when a high frequency clock signal is inputted.

There is no need to provide any pad exclusive for the test. It is possible to conduct the test after the semiconductor device was assembled.

Consequently, the above novel synchronous semiconductor memory device is provided with the pseudo internal command signal generator for generating the pseudo internal command signal which controls, in non-synchronizng with an externally inputted clock signal, an internal command signal having been generated in synchronizing with the externally inputted clock signal, so that a test can be made under substantially equivalent condition to a desirable test by sequential command inputs at high frequency, even when the low frequency tester is used or the test at the high frequency is difficult.

In the foregoing embodiments, the pseudo internal command signal is generated to the pre-charge command. Needless to say, however, it is possible to form a circuit for generating an internal command signal in non-synchronizing with the clock signal against the other command signals. The above novel synchronous semiconductor memory device is provided with the pseudo internal command signal generator for generating the pseudo internal command signal which controls, in non-synchronizing with an externally inputted clock signal, an internal command signal having been generated in synchronizing with the externally inputted clock signal, so that a test can be made to detect defectiveness and switch into the spare circuit under substantially equivalent condition to a desirable test by sequential command inputs at high frequency, even when the low frequency tester is used or the test at the high frequency is difficult. This may improve the yield of the synchronous semiconductor memory device.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A synchronous semiconductor memory device comprising:
    a command decoder;
    a row address control circuit provided with command signal inputs from said command decoder;
    a pseudo internal command signal generator for generating a pseudo internal command signal which controls, in non-synchronism with an externally inputted clock signal, an internal command signal having been generated in synchronism with the externally inputted clock signal, said internal command signal being provided as a direct input to said row address control circuit,
        wherein said pseudo internal command signal generator comprises a test mode signal connector and a tester circuit for generating the pseudo internal command signal in accordance with the internal control signal.

2. The synchronous semiconductor memory device as claimed in claim 1, wherein said pseudo internal command signal generator comprises a non-bonding pad and the pseudo internal command signal is generated by an input signal into said non-bonding pad.

3. The synchronous semiconductor memory device as claimed in claim 1, wherein the pseudo internal command signal is generated in synchronizing with an asynchronous signal externally inputted.

4. A synchronous semiconductor memory device provided with a pseudo internal command signal generator for generating a pseudo internal command signal which controls, in non-synchronism with an externally inputted clock signal, an internal command signal having been generated in synchronism with an externally inputted clock signal, said internal command signal being provided as an input to a row address control signal generator to reset an output signal of said row address control signal,
    wherein the pseudo internal command signal is generated by a circuit having a test mode signal input into an internal control signal in non-synchronism with the clock signal without being input into a command decoder for receiving a normal input signal and outputting a synchronous signal with the clock signal.

5. The synchronous semiconductor memory device as claimed in claim 4, wherein the pseudo internal command signal is generated upon a signal inputted into non-bonding pads.

6. The synchronous semiconductor memory device as claimed in claim 4, wherein in accordance with the internal control signal generated by an input of a command, there is provided a circuit for generating an internal command signal of another command.

7. A synchronous semiconductor memory comprising:
    a command decoder with outputs providing first and second internal command signals;
    a row address control circuit with first, second, and third inputs accepting the first and second internal command signals and a third internal command signal respectively;
    a pseudo internal command signal generator for generating a pseudo internal command signal serving as the third internal command signal, the third internal command signal controlling said row address control circuit non-synchronously with an externally inputted clock signal, the third internal command signal having been generated in synchronism with the externally inputted clock signal,
        wherein said pseudo internal command signal generator comprises a first input signal terminal feeding a first invertor, and an output of said first invertor serving as the third internal command signal,
        said pseudo internal command signal generator further comprises a second input terminal feeding said first invertor via a NAND gate and a delay circuit, and
        said pseudo internal command signal generator further comprises a third input terminal feeding said first invertor via said NAND gate.

8. The synchronous semiconductor memory of claim 9, wherein said pseudo internal command signal generator further comprises a second invertor in series with said first invertor; and said first input signal terminal comprises a non-bonded input pad adapted to accept an input signal.

9. The synchronous semiconductor memory of claim 7, wherein said second input terminal is adapted to accept a write control signal.

10. The synchronous semiconductor memory of claim 9, wherein said third input terminal is adapted to accept a write control signal, said second input terminal is adapted to accept a row address strobe, and said delay circuit comprises a second invertor.

* * * * *